United States Patent [19]

Washington

[11] 4,445,084
[45] Apr. 24, 1984

[54] CIRCUIT TESTER

[76] Inventor: Hubert L. Washington, 2 Whitecroft Pl., Islington, Ontario, Canada

[21] Appl. No.: 421,153

[22] Filed: Sep. 22, 1982

[51] Int. Cl.³ .................... G01R 31/02; G01R 13/42
[52] U.S. Cl. ..................................... 324/51; 324/133
[58] Field of Search ............... 324/51, 122, 133, 115, 324/60 R, 383, 387, 385

[56] References Cited

U.S. PATENT DOCUMENTS 4,020,413 4/1977 Wetherbee .................... 324/383

FOREIGN PATENT DOCUMENTS 2846674 4/1980 Fed. Rep. of Germany ...... 324/133
2373067 8/1978 France ............................. 324/133

Primary Examiner—Stanley T. Krawczewicz
Assistant Examiner—Jose M. Solis
Attorney, Agent, or Firm—George A. Rolston

[57] ABSTRACT

A circuit tester having a low tension test circuit, and a high tension lamp, a series resistance in the high tension test circuit, a shunt resistance connected around the high tension lamp means in the high tension test circuit, a first connection device connectable to a selected one of the low and high tension test circuits, and, a second connection device connected to the low and high tension test circuits.

3 Claims, 4 Drawing Figures

CIRCUIT TESTER

The invention relates to a multi-use circuit testing device.

BACKGROUND OF THE INVENTION

Testing of electrical circuits is frequently required in situations where it is not always practical to use a large professional circuit testing device. For example, testing of the ignition circuits in automobiles, and small engines such as lawn mowers, boats and the like is often carried out without any instruments at all, simply by checking various plug leads. This operation requires two people, one to crank the engine and the other to watch for the occurrence of a spark. In addition, this method of testing is crude and unreliable, and often results in shock hazards.

Testing of ignition components, such as the capacitor, is impossible using these techniques.

For these reasons, it is apparent that there is a need for a low cost light-weight portable circuit testing device which can be used for checking a variety of different types of circuits, for example engine high tension circuits, and low voltage circuits, and is of such a design that it can be manufactured and sold at a relatively low cost and is reliable in use and is as far as possible safe from electrical shock hazards to the user, or damage by misuse.

BRIEF SUMMARY OF THE INVENTION

With a view to overcoming these various problems the invention provides a circuit tester comprising a first low tension circuit, low tension lamp means in said circuit, a second capacitor test circuit, reference capacitor means in said second circuit, a third high tension circuit, high tension lamp means in said circuit responsive to a high tension voltage in said circuit, and resistance means in said third circuit in series with said lamp means, shunt resistance means connected around said high tension lamp means in said third circuit to shunt a portion of the current flowing therein, first connection means releaseably interengageable with a circuit to be tested, and being connected to said first, second and third circuits, and second connection means releaseably interengageable with a portion of a circuit to be tested.

In one embodiment the invention employs multi-position switch means connected with said first, second and third circuits, and said shunt resistance, and with said second connection means, and adapted to selectively connect a selected one of said first, second and third circuits to said second connection means.

In another embodiment the invention dispenses with the use of such a multi-position switch, and instead employs a plurality of different input jacks.

In general, the invention will operate equally well either on a negative ground or a positive ground circuit, provided of course that the various test leads are connected properly.

In both forms of the invention, shock hazards which might arise, for example due to misuse of the device causing the capacitor to become charged up to coil output voltage, are avoided by providing a suitable discharge path, and suitable resistance so as to permit such a capacitor to become discharged over a relatively short period of time, yet without destroying the capacitor's usefulness for its intended purpose.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

IN THE DRAWINGS

DESCRIPTION OF A SPECIFIC EMBODIMENT

Figure 2:
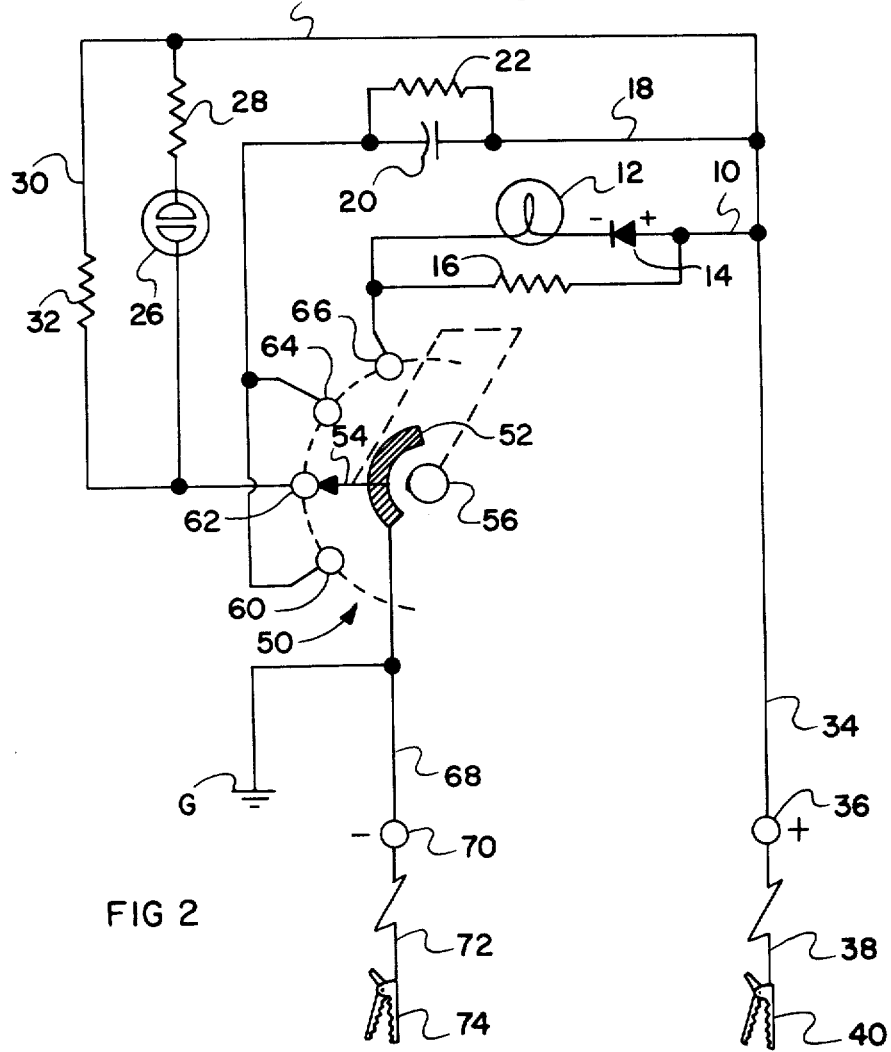
FIG. 2 is a schematic circuit diagram of the circuit tester according to the invention.

As shown in FIG. 2, the circuit tester device in accordance with the invention will be seen to comprise a first test circuit, namely a low tension circuit 10 having a low voltage lamp 12 therein. Lamp 12 will typically be a conventional twelve volt bulb. Circuit 10 is intended for testing low tension circuits such as the twelve volt circuit on an automobile. It may also be used as a "trouble lamp", subject to the limits of its candle power. Other voltages may be used for other applications. A diode 14 is connected in series with lamp 12, which thus ensures that lamp 12 will light up only when the connections are connected the right way around. This enables lamp 12 to be used for testing polarity, when the polarities of the low tension circuit or of the battery are not known. A shunt resistor 16 is located in parallel with lamp 12 and diode 14. Resistor 16 functions to protect diode 14, from a high inverse voltage which would cause damage if the device is repeatedly misused. It also acts as a safety feature, as described below.

A second test circuit, namely a capacitor circuit 18 is shown containing a reference capacitor 20 and a shunt resistor 22. Circuit 18 is used to substitute for a suspected faulty capacitor (not shown) on an automobile ignition system or other small engine ignition system for example, and the capacitor 20 will be typically of a similar value to that found in such ignition systems. Capacitor test circuit 18 can also be used to substitute for a suspected faulty radio noise suppression capacitor (not shown) of the type used with alternators, generators or other electrical devices on vehicles equipped with radios. The capacitance is reasonably close in value to that found in such noise suppression systems, and is in any event not critical, and will thus give an indication of whether or not such a noise suppression capacitor is defective.

It will of course be understood by those skilled in the art that in order to effectively test a faulty radio noise suppression capacitor, it will be highly desirable to use the shortest possible leads for connection between the test device according to the invention and the connection points for the radio noise suppression capacitor. The reason for this is that if relatively long leads are used, they may well pick up enough ignition noise from the engine to nullify the value of the test. The engine and radio are of course required to be running in order to carry out the test, so that the result of the test will be evident in the performance of the radio when the engine is running.

Accordingly, if possible, the connection leads will be securely fastened to the test device according to the invention, and will be as short as possible and will have some means for securing them directly to the two connecting points for the suspected capacitor (this capacitor having already been removed), and will preferably be such as to be capable of supporting the weight of the entire test device for the duration of the test.

A third test circuit, namely a high tension circuit 24 contains a high voltage lamp 26 typically being a Neon (trade mark) bulb suitable to provide a visible flash of illumination when activated by the high tension or spark circuit of an engine such as an automobile engine or the like. Resistance 28 is included in circuit 24 to protect lamp 26 from overloading.

A shunt circuit 30 having a shunt resistance 32, is also connected to circuit 24 in parallel with the lamp 26 and resistance 28. The function of shunt circuit 30 is to shunt a proportion of the current flowing in high tension circuit 24 so as to avoid overloading the bulb 26.

Circuits 10, 18 and 24 are all connected by a single connection wire 34, to an exterior terminal 36, of any suitable type on the exterior of the device.

Figure 1:
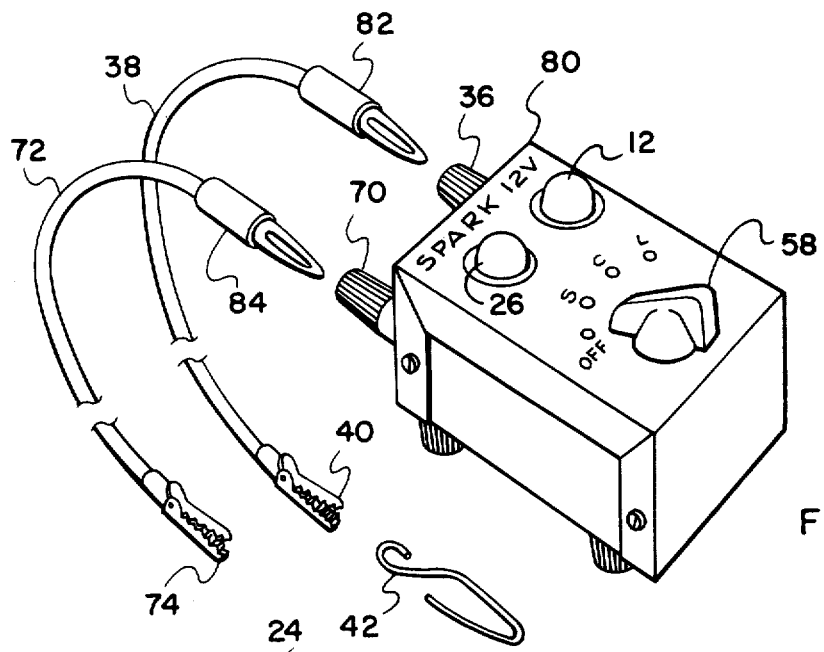
FIG. 1 is an isometric drawing of the circuit tester with separate test leads and ignition wire adapter.

In the FIG. 2 configuration, a single removable positive connection wire 38 is provided, and having releaseable connection means such as the clip 40, by means of which it may be releaseably attached to the positive side of any circuit to be tested. FIG. 1 shows a special adapter 42 made of galvanized steel wire. Adapter 42 is used for connecting the positive connection lead 38 to recessed spark plug connectors on ignition harnesses, or to the output terminals of a distributor cap. A piece of wire such as a paper clip or small safety pin may also be used for this purpose.

In order to select the particular mode of operation, a multi-position switch indicated generally as 50 is provided. In this example, switch 50 has an arcuate bus bar 52. A sliding contact 54 is rotatable about a common axis 56 operated by a single switch knob 58 (FIG. 1). Other types of multiple-position switch may also be used to accomplish the same electrical result.

Four separate fixed contacts 60, 62, 64 and 66 are provided, angularly spaced apart about bus bar 52, and are adapted to be contacted by contact 54.

Contact 62 is connected both to shunt circuit 30 and bulb 26 in circuit 24. Contacts 60 and 64 are connected to the capacitor test circuit 18. Contact 66 is connected to low tension test circuit 10.

Bus bar 52 is connected to a negative wire 68 and provides the floating ground G.

Negative wire 68 is in turn connected to a suitable terminal 70 on the exterior of the device. A removable negative connection wire 72 having a releaseable electrical connector such as the clip 74 is interengageable with the terminal 70.

As best shown in FIG. 1, the circuit testing device described above may be contained in a suitable box 80 having suitable openings exposing the bulbs 12 and 26. Switch knob 58 is provided for controlling the switch 50. Positive and negative connection leads 38 and 72 are shown in FIG. 1, being removably connectable with terminals 36 and 70, by means of plugs 82 and 84.

It will thus be seen that the entire box 80 can be small, in the region of three to four inches by two to three inches by one to two inches, and different forms of leads 38 and 72 can be provided if desired, so that the whole device is light-weight and readily portable, and may be in fact stored for example in a glove compartment or trunk of an automobile, or included in any handyman's tool kit, so that it is always available for use.

It will of course be appreciated that, if desired, a manufacturer might provide a switch with only three positions, thus eliminating the "off" position 60. However, the four position switch is considered more desirable to avoid confusion to the user.

In operation, the movable contact 54 is normally in the off position in which contact 54 is engaged with contact 60. Suitable stops (not shown) in the switch 50 will prevent switch contact 54 from being rotated anti-clockwise past the off position, or clockwise past contact 66.

The user will normally start with the switch 50 in the off position, and will then rotate it to the selected position before commencing the test.

In the off position with contact 54 at position 60, if a user attempts to make a high tension circuit test, all of the energy is simply shunted to ground through resistor 22.

This feature is provided to minimize shock hazard in the event that the user does in fact connect the leads 38–72, and cranks or starts the engine before moving the switch selector to the desired test. This is an incorrect mode of operation, but none the less, such misuse of the device will not produce an electric shock or damage to the device.

In the correct mode of operation, for a high tension circuit test, the user will first of all move the switch knob 58 so that contact 54 is at position 62.

Position 62 is connected to the high tension test circuit 24, and bulb 26 and also to the shunt circuit 30.

The leads 38–72 are then connected to the points in the high tension circuit which it is desired to test, and the engine is then cranked. High tension current will then pass through bulb 26 and some of it will be shunted through shunt circuit 30. Assuming the high tension circuit is operating correctly, the bulb 26 will flash. Clearly, if there is a fault, the bulb 26 will not flash, or will show an inferior flash compared with normal operation.

The other circuits in the circuit testing device are not connected at this point, and will not normally be involved in such a test. If, during a high tension test a short circuit is caused by condensation moisture, the most likely location would be either between switch terminals or from switch to case. For this reason it is felt that a switch circuit at ground potential is safer than a switch circuit at high tension potential, although under normal conditions there is no difference in performance.

A further opportunity for misuse, when making a high tension test, could arise when the contact 54 has been moved to position 64. In this case, the capacitor 20 will pick up and temporarily retain a very high voltage charge. During engine cranking, the capacitor 20 will be continuously charged up, and resistor 22 will allow the incoming high voltage pulse energy to bypass capacitor 20, so that danger of flash-over within the box or across the switch is removed. This charge will be discharged over a relatively short time period by shunt resistor 22 after engine cranking has ceased. Resistor 22 is of fairly high value, and does not, therefore, interfere with the proper operation of the capacitor 20 in its normal test use.

In addition, if a high tension test is attempted as above with the contact 54 at position 64, resistor 22 is also useful in preventing strain on diode 14. In this case there would be a tendency for high voltage pulses to pass through the low tension circuit 10, short circuiting between contacts 66 and 64, which in most such switches are separated by a relatively small space. Resistor 22 prevents flash-over damage to diode 14 by providing an easier path to ground.

When the switch knob 58 is again returned to the off position, with contact 54 at position 60, any residual charge on the capacitor 20 is discharged through resistor 22.

If the user wishes to test the capacitor in the ignition system, or for example the radio noise suppression capacitor, then he would normally move knob 58 so that contact 54 is in position 64.

A capacitor failure can result in three conditions, namely, (a) an open capacitor in which no current will pass;
(b) a shorted capacitor in which case current will pass freely;
(c) a leak through the capacitor, i.e. a partial short.

In order to make an effective test, it is therefore desirable to disconnect the capacitor from the circuit to be tested and replace it with the capacitor test circuit 18. This will involve in many cases physically removing the capacitor, or at least disconnecting the lead to one end. Depending upon the type of equipment, more or less work will be involved in doing this. For example, in an automobile ignition system, the substitution of the capacitor test circuit 18 in place of the automobile capacitor will not be too difficult because the substitution can be made externally between the distributor low tension terminal and engine ground. On the other hand, in certain types of small engines, such as in lawn mowers, it may be necessary to remove other parts of the engine before access can be had to the capacitor.

In any event, once the suspect capacitor has been removed, the testing device according to the invention is connected by means of the leads 38 and 72. The circuit is then activated typically by cranking the engine. The capacitor 20 in test circuit 18 will then function to replace the suspect capacitor which has been removed. The engine or other piece of equipment should then come to life and function normally. This will indicate that the suspect capacitor must be replaced.

Clearly, in some cases it will be possible to make the necessary connections at different points in the circuit after either physically disconnecting a lead on the suspected capacitor itself, or removing the capacitor entirely. This may be possible in certain types of ignition systems, where access may be had to the capacitor leads at some point remote from the capacitor itself.

If the user wishes to test for a fault in the low voltage circuits, then the switch is moved so that contact 54 is in position 66. In this position, leads 38 and 72 are connected wherever a test is desired. Assuming the lamp 12 lights up, then it indicates that a voltage exists. However, if the lamp fails to light, then it may be possible that the test is being made the wrong way around, or that the battery is connected backwards. In either case, the leads should simply be reversed and the test repeated, before it is actually assumed that there is no voltage at all. Note that the presence of diode 14 permits the lamp 12 to be used as a polarity tester, as described previously, if for example it is desired to test the polarity of the battery. Shunt resistor 16 is considerably larger than the resistance of the lamp circuit 10, so that its presence does not cause any visible effect on the brightness of lamp 12, nor does it affect the usefulness of diode 14. Its purpose is as a safety feature to be described later.

Figure 3:
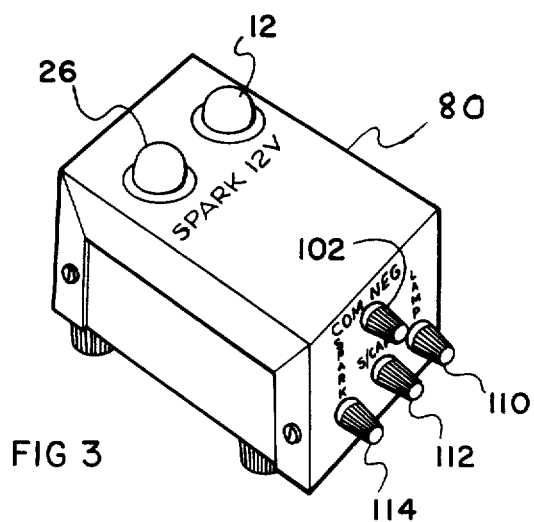
FIG. 3 is an isometric drawing of an alternate form of circuit tester, using separate input jacks, and, FIG. 4 is a schematic circuit diagram of the alternate embodiment.
Figure 4:
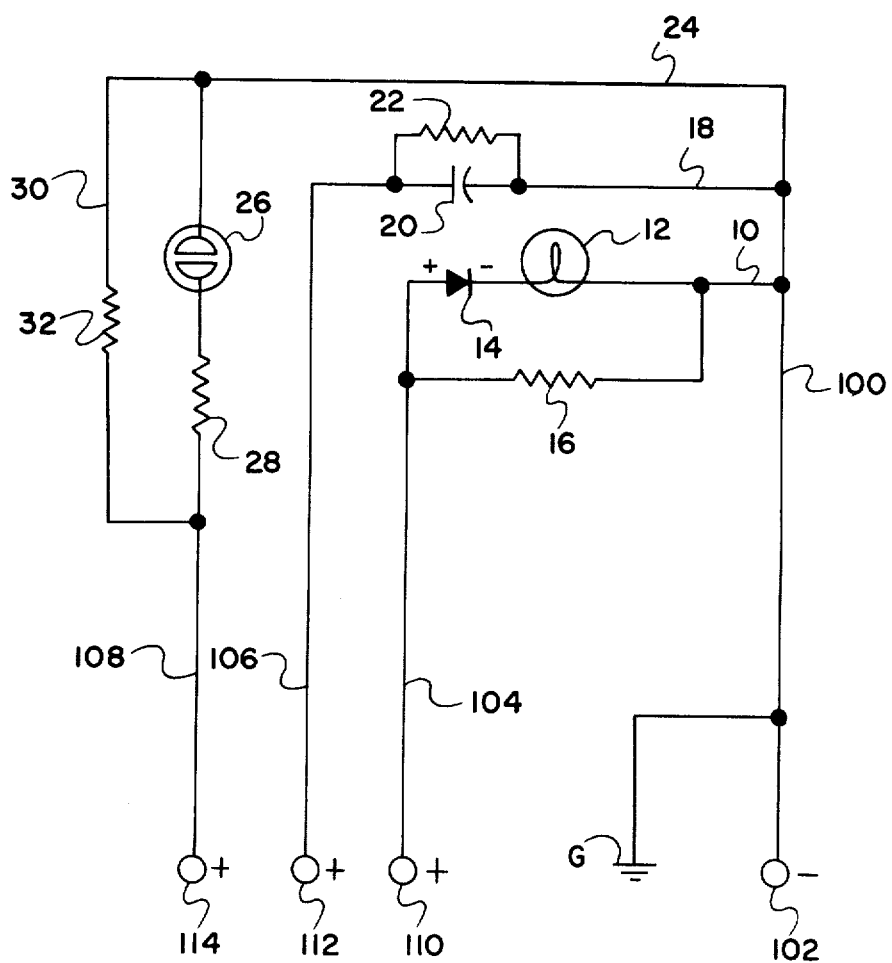

A modified form of the invention is shown in FIGS. 3 and 4. In this case, the switch 50 has been eliminated. This will permit a lower cost device.

In the modified form of the invention as shown in FIGS. 3 and 4, there are the same basic test circuits, namely the low tension test circuit 10, the capacitor test circuit 18, and the high tension test circuit 24. Similarly, the low tension test circuit has a bulb 12, diode 14 and shunt resistance 16. The capacitor test circuit 18 has a capacitor 20 and shunt resistance 22, and the high tension test circuit 24 has a bulb 26 and resistance 28, and a shunt circuit 30 with a resistance 32.

There are, however, certain changes. Thus a common negative or ground wire 100 is provided, connected to all three circuits 10, 18 and 24. It is provided with a terminal 102, for connection to a suitable extension or lead (not shown).

Three separate positive connection wires are provided, namely 104, connected to test circuit 10, and 106, connected to test circuit 18, and 108, connected to test circuit 24. They are each provided with separate terminals 110, 112 and 114. In this way, individual test circuits can be selected simply by connecting test leads (not shown) into the appropriate terminals.

Due to the fact, however, that the common wire is the negative wire 100, it has been necessary to make certain rearrangements. Thus, the diode 14 in circuit 10 is shown connected the opposite way around, so that lamp 10 will operate when the test leads are connected with correct polarity.

Similarly, the capacitor 20 is shown with its symbols indicating that it is connected in the reverse direction.

No changes are made in the high tension test circuit 20.

Subject to these changes, the circuit tester of FIGS. 3 and 4 operates essentially the same way as the circuit tester of FIG. 2. Thus, in the normal mode of operation, a negative lead will always be connected to terminal 102 and a positive lead will be connected to terminal 114, for making a high tension test.

Assuming a test is carried out correctly, then the bulb 26 will either flash or not, or give an inferior flash. The other two circuits 10 and 18 are not connected and are therefore not involved.

If it is desired to make a capacitor test, then the positive connection lead is connected to terminal 112, and the negative lead is connected to terminal 102. If the test is carried out normally, and the problem is rectified, then it indicates a faulty capacitor.

If, with the lead connected to terminal 112, it is attempted to carry out a high tension test, then the capacitor 20 will become charged up, so long as the engine is cranking. The resistor 22 will bypass the incoming high energy voltage pulse generated during engine cranking, and, when engine cranking is discontinued, it will discharge any residual charge on the capacitor.

Low tension testing is carried out by connecting a positive and a negative lead to terminal 102. In the event that in either of the embodiments of FIG. 2 or 4, a high tension test is inadvertently carried out while selecting the low tension test circuit, the high tension current will pass through the lamp circuit 10 without causing any damage or visible effect, because the current is so low. If this inadvertent test is carried out with the connections made backwards, then diode 14 will prevent current flow in the lamp circuit 10, while the resistor 16 will shunt current flow past diode 14 and lamp 12. In this way, shunt resistor 16 helps in protecting diode 14 from inverse high voltage damage, and also removes a possible shock hazard by providing a suitable path to ground.

In both embodiments of the invention, all tests, with the exception of the low tension lamp test, may be carried out with the test lead connections reversed. However, it is recommended that the proper connections should be made. In the case of the low tension circuit 10, it is intended that the circuit shall be used as a polarity tester. Connecting it the wrong way around and then connecting it in the correct manner, would give an indication of the polarity of the source.

Another possible misuse would be if in the embodiment of FIGS. 3 and 4, a user should attempt to test while having both leads connected to any two of the positive terminals 110, 112 or 114. For example, if a high tension test were made using terminal 110 as the ground connection, there would be no damage to the device and there would be no shock hazard, because of the use of the shunt resistors in the design. Similarly, all other incorrect combinations of positive terminal connections, with one of them being used as the ground, would not damage the device or create any hazard.

The foregoing is a description of preferred embodiments of the invention which are given here by way of example only. The invention is not to be taken as limited to any of the specific features as described, but comprehends all such variations thereof as come within the scope of the appended claims.

What is claimed is:

1. A circuit tester for use in association with a circuit to be tested comprising;
    a low tension test circuit;
    a high tension test circuit, and,
    a capacitor test circuit, each of said test circuits defining a positive side and a negative side;
    each of one of said sides being electrically connected to define a first terminal of said circuit tester, the other said side of any selected one of said test circuits defining a second terminal;
    first connection means releasably interengageable with the circuit to be tested and being connectable to one said terminal, and,
    second connection means releasably interengageable with the circuit to be tested and being connectable to the other said terminal;
    wherein said low tension test circuit includes a low tension lamp means, a diode means connected in series with said low tension lamp means and a first resistance means connected in parallel with said diode means and said low tension lamp means, said low tension test circuit being operable to indicate the polarity and the acceptability of the circuit to be tested according to the illumination of the said low tension lamp means;
    wherein said high tension test circuit includes a high tension lamp means responsive to high tension voltage across said high tension test circuit, a second resistance means connected in series with said high tension lamp means, and a third resistance means connected in parallel with said second resistance means and said high tension lamp means, said high tension test circuit being operable to indicate the acceptability of the circuit to be tested according to the illumination of the said high tension test means, and,
    wherein said capacitor test circuit is operable to test a capacitor included in said circuit to be tested, said capacitor test circuit including a reference capacitor means and a fourth resistance means connected in parallel with said reference capacitor, said capacitor test circuit being operable by substitution of said reference capacitor for said capacitor to be tested and whereby the acceptability of the operation of the said circuit to be tested, having said reference capacitor substituted for said capacitor to be tested, indicates the acceptability of said capacitor to be tested.

2. A circuit tester as claimed in claim 1 including a selector switch means operable to select the said other side of any one of said test circuits to define said second terminal.

3. A circuit tester as claimed in claim 2 wherein said positive sides define said first terminal, whereby said first terminal defines a positive terminal.

* * * * *